(12) United States Patent
Son et al.

(10) Patent No.: US 11,788,183 B2
(45) Date of Patent: Oct. 17, 2023

(54) METHOD FOR GROWING CRYSTALLINE OPTICAL FILMS ON SI SUBSTRATES WHICH MAY OPTIONALLY HAVE AN EXTREMELY SMALL OPTICAL LOSS IN THE INFRA-RED SPECTRUM WITH HYDROGENATION OF THE CRYSTALLINE OPTICAL FILMS

(71) Applicant: HRL Laboratories, LLC, Malibu, CA (US)

(72) Inventors: Kyung-Ah Son, Moorpark, CA (US); Jeong-Sun Moon, Moorpark, CA (US); Hwa Chang Seo, Malibu, CA (US); Richard M. Kremer, Ramona, CA (US); Ryan G. Quarfoth, Malibu, CA (US); Jack A. Crowell, Malibu, CA (US); Mariano J. Taboada, Malibu, CA (US); Joshua M. Doria, Malibu, CA (US); Terry B. Welch, Malibu, CA (US)

(73) Assignee: HRL LABORATORIES, LLC, Malibu, CA (US)

(*) Notice: Subject to any disclaimer, the term of this patent is extended or adjusted under 35 U.S.C. 154(b) by 0 days.

(21) Appl. No.: 17/206,927

(22) Filed: Mar. 19, 2021

(65) Prior Publication Data

US 2021/0363629 A1 Nov. 25, 2021

Related U.S. Application Data

(60) Provisional application No. 63/027,849, filed on May 20, 2020, provisional application No. 63/027,847, filed on May 20, 2020.

(51) Int. Cl.
*C23C 14/35* (2006.01)
*C23C 14/08* (2006.01)

(52) U.S. Cl.
CPC .............. *C23C 14/08* (2013.01); *C23C 14/35* (2013.01)

(58) Field of Classification Search
CPC ..... C23C 14/08; C23C 14/35; C23C 14/5846; H01L 45/14
(Continued)

(56) References Cited

U.S. PATENT DOCUMENTS 4,466,703 A 8/1984 Nishimoto
6,373,620 B1 4/2002 Wang
(Continued)

FOREIGN PATENT DOCUMENTS

CN 106480413 A 3/2017
CN 106756793 A 5/2017
(Continued)

OTHER PUBLICATIONS

PCT International Search Report and Written Opinion from PCT/US2021/023265 dated Jul. 8, 2021.
(Continued)

*Primary Examiner* — Rodney G McDonald
(74) *Attorney, Agent, or Firm* — Ladas & Parry, LLP (57) ABSTRACT

A process enables growing thick stoichiometric crystalline and preferably IR-transparent optical PCMO material on Si and other substrates. Sputter deposition is carried out in oxygen-free inert gas (e.g., Ar) environment, which helps to prevent decomposition of the PCMO material over the substrate. In the disclosed process, there is no need to add a seed layer prior to PCMO deposition. Moreover, no post-deposition annealing is needed in a high-temperature and high-pressure oxygen furnace, but an anneal provides certain additional benefits in terms of improved transparency at IR wavelengths. Over a long deposition time for a thick PCMO film on the high temperature (≥450° C.) substrates,
(Continued)

the PCMO deposition is made repeated cycles of deposition of the PCMO material at the high temperature, each deposition cycle being followed by cooling the PCMO-deposited substrate to a substantially lower temperature (<50° C.). If an anneal is applied in a hydrogen environment that will cause hydrogenation of the PCMO film which yields PCMO films with an extremely small optical loss (i.e., optical extinction coefficient k<0.001) over the entire IR range.

17 Claims, 11 Drawing Sheets

(58) Field of Classification Search
USPC ........................................ 204/192.12–192.29
See application file for complete search history.

(56) References Cited

U.S. PATENT DOCUMENTS

| | | |
|---|---|---|
| 7,312,917 B2 | 12/2007 | Jacob |
| 10,955,720 B2 | 3/2021 | Son |
| 2005/0014033 A1 | 1/2005 | Cheung |
| 2006/0050358 A1 | 3/2006 | Bigman |
| 2007/0053139 A1 | 3/2007 | Zhang |
| 2007/0171504 A1 | 7/2007 | Fujimori |
| 2008/0212007 A1 | 9/2008 | Meredith |
| 2010/0309539 A1 | 12/2010 | Kaye |
| 2011/0038093 A1 | 2/2011 | Furukawa |
| 2013/0063805 A1 | 3/2013 | Arnold |
| 2016/0170244 A1 | 6/2016 | Ho |
| 2016/0266465 A1 | 9/2016 | Rastegar |
| 2017/0031231 A1 | 2/2017 | Bhaskaran |
| 2017/0054099 A1 | 2/2017 | Friend |
| 2017/0113951 A1 | 4/2017 | Su |
| 2018/0046056 A1 | 2/2018 | Na |
| 2018/0059440 A1 | 3/2018 | Yu |
| 2018/0158616 A1 | 6/2018 | Lazarev |
| 2019/0129275 A1 | 5/2019 | McManamon |
| 2019/0278150 A1 | 9/2019 | Son |
| 2021/0364884 A1 | 11/2021 | Kremer |

FOREIGN PATENT DOCUMENTS

| | | |
|---|---|---|
| JP | 2007-147934 | 6/2007 |
| JP | 2016-050951 A | 4/2016 |
| KR | 10-2019-0092062 A | 8/2019 |
| KR | 10-2020-0029924 A | 3/2020 |

OTHER PUBLICATIONS

PCT International Search Report and Written Opinion from PCT/US2021/020544 dated Jun. 23, 2021.
PCT International Search Report and Written Opinion from PCT/US2021/023352 dated Jun. 22, 2021.
Boileau, A. et al. "Mechanisms of Oxidation of $NdNiO_{3-\delta}$ Thermochromic Thin Films Synthesized by a Two-Step Method in Soft Condition", The Journal of Physical Chemistiy C, 2014, vol. 118, Iss. 11, pp. 5908-5917.
Neumann, B. et al. "Niobium-doped $TiO_2$ films as window layer for chalcopyrite solar cells", Physica Status Solidi B, 2008, vol. 245, No. 9, pp. 1849-1857 (11 pages).
Zewei Shao et al., 'Recent progress in the phase-transition mechanism and modulation of vanadium dioxide materials', NPG Asia Materials, Jul. 25, 2018, pp. 581-605 [Retrieved on May 27, 2021]. Retrieved from the Internet: <URL: https://www.nature.com/articles/s41427-018-0061-2>.
U.S. Appl. No. 17/190,031, filed Mar. 2, 2021, Kremer.
U.S. Appl. No. 17/206,756, filed Mar. 19, 2021, Kremer.
U.S. Appl. No. 17/212,611, filed Mar. 25, 2021, Son.
From U.S. Appl. No. 16/296,049 (now U.S. Pat. No. 10,955,720), Notice of Allowance dated Nov. 24, 2020.
From U.S. Appl. No. 16/296,049 (now U.S. Pat. No. 10,955,720), Office Action dated Aug. 14, 2020.
PCT International Preliminary Report on Patentability (Chapter II) for PCT/US2019/021233 dated Sep. 25, 2019.
PCT International Search Report for PCT/US2019/021233 dated Jun. 26, 2019.
PCT Written Opinion of the International Searching Authority for PCT/US2019/021233 dated Jun. 26, 2019.
Chung, S., et al., "A Monolithically Integrated Large-Scale Optical Phased Array in Silicon-on-Insulator CMOS", IEEE Journal of Solid-State Circuits, vol. 53, Issue 1, pp. 275-296, Jan. 2018.
Ha, et al., "Examination of insulator regime conduction mechanisms in epitaxial and polycrystalline $SmNiO_3$ thin films", Journal of Applied Physics, 110, 094102 (2011),.
Hanlon, "Eyeglasses with Adaptive Focus", New Atlas, Health and Well Being, Apr. 15, 2006, https://newatlas.com/eyeglasses-with-adaptive-focus/5516 (printed: Jun. 3, 2021).
Helmbrecht, et al., "Piston-tip-tilt positioning of a segmented MEMS deformable mirror," Proceedings of SPIE 6467, MEMS Adaptive Optics, 64670M (Feb. 9, 2007).
Li, Z., et al., "Correlated Perovskites as a New Platform for Super-Broadband-Tunable Photonics", Advanced Materials, 28, 9117-9125 (2016) and Supporting Information.
Milanovic, V., et al., "Tip-tilt-piston Actuators for High Fill-Factor Micromirror Arrays", Solid-State Sensor, Actuator and Microsystems Workshop, Jun. 6-10, 2004, pp. 232-237, www.adriaticresearch.org/Research/pdf/HHH04.pdf.
Shi, et al., "Colossal resistance switching and band gap modulation in a perovskite nickelate by electron doping", Nature Communications 5, 4860 (2014) doi:10.1038/ncomms5860 (9 pages).
Shi, J., et al. "A correlated nickelate synaptic transistor" Nature Communications 4, 2676 (2013) doi:10.1038/ncomms3676 (9 pages).
From U.S. Appl. No. 17/190,031 (now US 2021-0364884 A1), Notice of Allowance dated Jan. 4, 2022.
From U.S. Appl. No. 17/190,031 (now US 2021-0364884 A1), Office action dated Sep. 30, 2021.
Phare, et al., "Silicon Optical Phased Array with High-Efficiency Beam Formation over 180 Degree Field of View" Department of Electrical Engineering, Columbia University, New York, NY 10027, USA, which may be found at arXiv: 1802.04624, 2018.
PCT International Preliminary Report on Patentability (Chapter II) from PCT/US2021/023352 dated May 19, 2022.
PCT International Preliminary Report on Patentability from PCT/US2021/023265 dated Dec. 1, 2022.
From U.S. Appl. No. 17/206,756 (now published as US 2021-0364881 A1), Office Action dated Mar. 30, 2023.

METHOD FOR GROWING CRYSTALLINE OPTICAL FILMS ON SI SUBSTRATES WHICH MAY OPTIONALLY HAVE AN EXTREMELY SMALL OPTICAL LOSS IN THE INFRA-RED SPECTRUM WITH HYDROGENATION OF THE CRYSTALLINE OPTICAL FILMS

CROSS REFERENCE TO RELATED APPLICATIONS

This application claims the benefit of U.S. Provisional Patent Application Ser. No. 63/027,849 filed 20 May 2020 and entitled "Method to Grow Thick Crystalline Optical Films on Si Substrates", the disclosure of which is hereby incorporated herein by reference.

This application also claims the benefit of US Provisional Patent Application Ser. No. 63/027,847 filed 20 May 2020 and entitled "Method to Grow IR Optical Materials with Extremely Small Optical Loss", the disclosure of which is hereby incorporated herein by reference.

This disclosure is related to U.S. patent application Ser. No. 16/296,049 filed 7 Mar. 2019 entitled "Electrically Reconfigurable Optical Apparatus Using Electric Field", the disclosure of which is hereby incorporated herein by reference.

This application is related to U.S. Provisional Patent Application Ser. No. 63/027,838 filed 20 May 2020 and entitled "Solid State Electrically Variable-Focal Length Lens", the disclosure of which is hereby incorporated herein by reference.

This application is also related to U.S. Provisional Patent Application Ser. No. 63/027,841 filed 20 May 2020 and entitled "Solid State Electrically Variable Optical Wedge", the disclosure of which is hereby incorporated herein by reference.

This application is also related to U.S. Provisional Patent Application Ser. No. 63/027,844 filed 20 May 2020 and entitled "Solid State Tip-Tilt Phased Array", the disclosure of which is hereby incorporated herein by reference.

STATEMENT REGARDING FEDERALLY SPONSORED RESEARCH OR DEVELOPMENT

This invention was conceived under US Government Contract NRO000-18-C-0102 and therefor the US Government may have certain rights in this invention.

TECHNICAL FIELD

This document describes novel methods to grow Crystalline Optical films, Phase-Change Correlated Transition Metal Oxides (PCMOs), on silicon substrates, the PCMOs preferably being Infrared (IR) transparent.

BACKGROUND

In the prior art, Samarium nickelate, $SmNiO_3$, (SNO) thin films with 60%-90% optical transmission in Infrared (IR) spectrum (=1 μm-90 μm) were attained with (1) Li-ion intercalation and (2) Pt-assisted proton intercalation. See, Z. Li, Y. Zhou, H. Qi, et al., "Correlated Perovskites as a New Platform for Super-Broadband-Tunable Photonics", Advanced Materials, 28, 9117 (2016), the disclosure of which is hereby incorporated herein by reference.

The growth of Thick Crystalline Optical films, Phase-Change Correlated Transition Metal oxides (PCMOs), on silicon substrates, can potentially enable Electric-field-controlled reconfigurable electro-optical devices that are compatible with the conventional microdevice fabrication and feasible for wafer-level integration with Si CMOS-based control electronics.

In the prior art, deposition of thin-film $SmNiO_3$ (SNO) on $SiO_2$/Si substrates was carried out with magnetron sputtering followed by extensive high-temperature annealing in a high-pressure oxygen furnace. SNO depositions on Si substrates in the prior art are limited to thin films only, and the deposited films are amorphous and the annealed films often contain binary Sm oxides and Ni oxides generated from the decomposition of SNO on the substrates during high-temperature annealing. The annealed films are oftentimes not stoichiometrically pure SNO. See: Shi, J., Ha, S., Zhou, Y. et al. "A correlated nickelate synaptic transistor" *Nat Commun* 4, 2676 (2013) doi:10.1038/ncomms3676; Shi, J., Zhou, Y. & Ramanathan, S. "Colossal resistance switching and band gap modulation in a perovskite nickelate by electron doping", *Nat Commun* 5, 4860 (2014) doi:10.1038/ncomms5860; and Sieu D. Ha, Gulgun H. Aydogdu, and Shriram Ramanathan "Examination of insulator regime conduction mechanisms in epitaxial and polycrystalline $SmNiO_3$ thin films", *J. App. Phys.* 110, 094102 (2011).

In the prior art, PCMO films are deposited in an oxygen environment set with constant flows of both Ar and $O_2$. See, Z. Li, Y. Zhou, H. Qi, et al., "Correlated Perovskites as a New Platform for Super-Broadband-Tunable Photonics", Advanced Materials, 28, 9117 (2016), the disclosure of which is hereby incorporated herein by reference.

Additionally, in the prior art, $SmNiO_3$ (SNO) thin films with 60%-90% optical transmission in Infrared (IR) spectrum (=1 μm-9 μm) were attained with (1) Li-ion intercalation and (2) Pt-assisted proton intercalation. See, Z. Li et al., "Correlated Perovskites as a New Platform for Super-Broadband-Tunable Photonics", noted above.

Li-ion intercalation (a liquid-phase electrochemical reaction) was carried out by applying a voltage between an SNO film coated with $LiClO_4$ electrolyte and a Li electrode (in contact with the electrolyte) to drive Li-ion transport into the SNO film. A Pt grating fabricated over a SNO film was used by to induce catalytic dissociation of $H_2$ at 300° C. to generate protons diffusing into the SNO film. See, Z. Li et al., "Correlated Perovskites as a New Platform for Super-Broadband-Tunable Photonics", noted above.

In the prior art, high-optical transparency SNO films were attained with the approaches based on (1) electrochemical reaction for Li-ion intercalation and (2) Pt grating-assisted catalytic dissociation of hydrogen. Both approaches have significant limitations in integration with practical optical systems (if possible at all) and have very limited utility. See, Z. Li et al., "Correlated Perovskites as a New Platform for Super-Broadband-Tunable Photonics", noted above The approach disclosed herein for growing IR-Transparent PCMO Optical films does not require any electrochemical reaction nor a Pt grating for electron doping in PCMO films.

BRIEF DESCRIPTION OF THE INVENTION

Over a long deposition time necessary for forming a thick PCMO film at high temperature (≥450° C.) on Si substrates, for example, the PCMO tends to decompose into binary transition metal oxides (for example, to $SmO_x$ and $NiO_x$ from $SmNiO_3$). To prevent decomposition of the PCMO in the course of a thick growth of the PCMO material, repeated cycles of thin (e.g., 150 nm) film layers followed by substrate cooling to ≤50° C. is described herein.

In the presently disclosed technology, relatively PCMO films are repeatedly deposited on a substrate and annealed (with cooling between the deposition of such films) in an oxygen-free environment, which prevents the decomposition of the PCMO films, enabling the successful growth of relatively thicker stoichiometric PCMO films on the substrate.

Described is a process that enables growing the target material (i.e., thick optical films), which the prior art fails to offer.

Additionally, the technology disclosed herein also enables the growth of IR-transparent optical PCMO films on substrates, and more particularly on Si substrates, with an extremely small optical loss (which we define herein as corresponding to an optical extinction coefficient (k)<0.001), which believed to be important for future electrically tunable solid-state beam forming/steering electro-optic devices. The disclosed process involves carrier doping of PCMO films sputter-deposited on Si substrates in a Rapid Thermal Annealing (RTA) system using a forming gas. The disclosed process is important for realizing novel electrically tunable optical devices that can be integrated into conventional CMOS electronics at a wafer-level, which has not been feasible due to the process temperatures previously required. For CMOS electronics the highest fabrication temperature should be no greater than 500° C. and preferably no greater than 350° C.

This technology disclosed herein provides a process enabling optical films that are transparent from the SWIR (shortwave infrared) to the LWIR (longwave infrared), which the prior art could not provide.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Disclosed is a novel process that enables growing thick stoichiometric crystalline IR-transparent optical films on Si substrates. An important feature in the disclosed deposition process is that both sputter deposition and post-deposition annealing are carried out in a substantially oxygen-free inert gas (e.g., Ar) environments, which are important to prevent decomposition of a PCMO material over the Si substrate. In process disclosed herein, there is no need for adding a seed layer prior to PCMO deposition. No post-deposition annealing is needed in a high-temperature and high-pressure oxygen furnace, although the advantages of a post-deposition anneal using hydrogen is discussed below. Over a long deposition time for a thick PCMO film on the high temperature ($\geq 450°$ C.) Si substrates, the PCMO tends to be decomposed into binary transition metal oxides: for example, to $NdO_x$ and $NiO_x$ from $NdNiO_3$ and to $SmO_x$ and $NiO_x$ from $SmNiO_3$.

To prevent decomposition of the PCMO during the course of a thick growth of the PCMO material, repeated cycles of deposition of thin (e.g., 150 nm or less) film layers followed by substrate cooling to $\leq 50°$ C. between each thin deposition cycle is accomplished until the thick target film thickness is reached. Dual/triple (or more) targets of a PCMO material may be sputtered simultaneously to shorten the average deposition time for thick films (films having a thickness greater than 300 nm), which also helps to prevent decomposition of the PCMO. PCMO films tend to decompose at the high temperature over a long deposition time so reducing deposition time while at the same time increasing the number of deposition cycles can address this problem. By using multiple deposition targets during each cycle help overcome the time loss due to the repetitive heating and cooling cycles. Details of the deposition process are described below. See also FIG. 1.

The term "thin film" is used herein for thicknesses $\leq 300$ nm, in some embodiments, while the term "thick film" is used herein for thickness $>300$ nm and more particularly for thicknesses in a range of 1 to 10 μm, in such embodiments. Whether a film or layer "thick" or "thin" depends more on how it is formed and/or utilized. A "thin" film or layer is formed during one elevated temperature event in a RF magnetron sputter chamber while a "thick" film or layer is formed during multiple elevated temperature events in the RF magnetron sputter chamber, with each elevated temperature event being used to form typically only one "thin" film or layer and each elevated temperature event being separated by intervening cooling events. In some of the disclosed embodiments, the heating events raise the substrate temperature to at least 400° C. while the cooling event lower the substrate temperature to 50° C. or less. The temperatures of the heating and cooling events are substantially different from each other.

Figure 1:
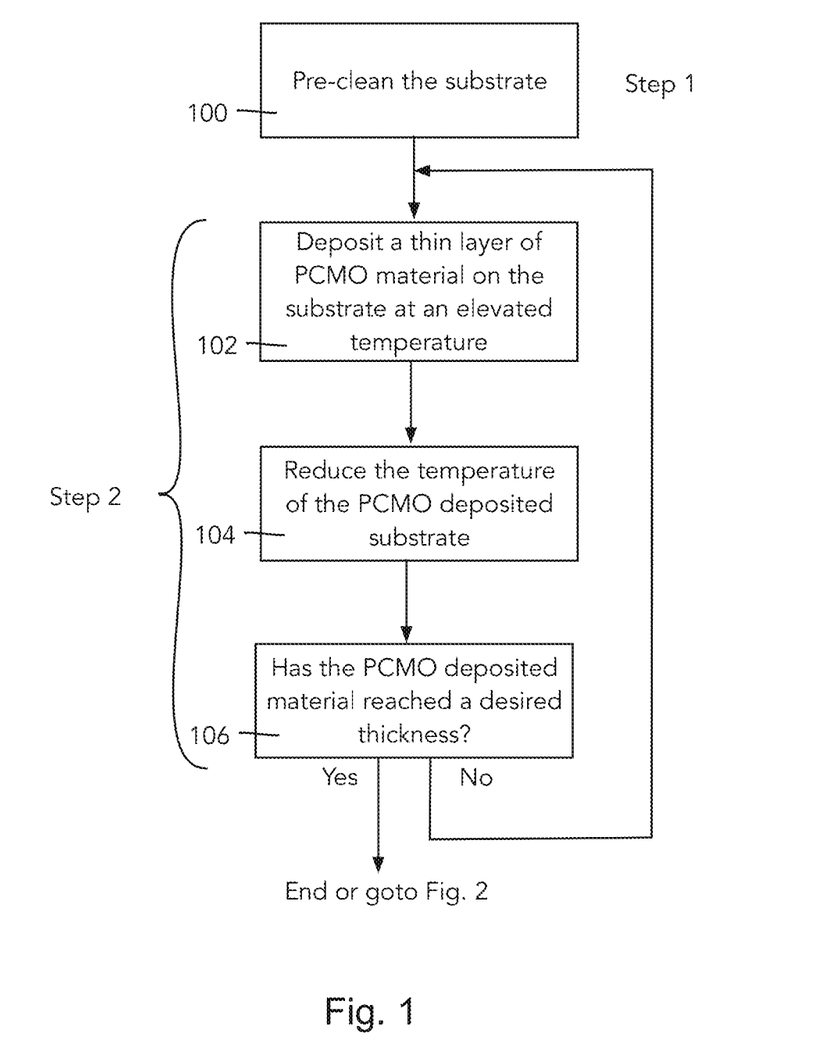
FIG. 1 is a flow chart showing processing steps described below to deposit PCMO material on a substrate by repeated deposition of relatively thin layers of PCMO material with intervening cooling steps to reduce decomposition of the PCMO material being deposited.

FIG. 1 is a flow chart showing processing steps described below to deposit PCMO material on a substrate by repeated deposition of relatively thin layers of PCMO material with intervening cooling steps to reduce decomposition of the PCMO material being deposited.

Step 1. Substrate Pre-Cleaning with Ar Sputtering, for Example, In Situ in a Sputtering Deposition System:

| Substrate Pre-cleaning | |
|---|---|
| Substrate | Si |
| Substrate Temp. | Room Temperature |
| Ar (sccm) | 25 sccm |
| Chamber Pressure | 5 mTorr |
| RF power | 50 W |
| Ar sputter clean Time | 20 min |
| Seed Layer | None |

This pre-cleaning of the substrate wafer at block 100 of FIG. 1 is preferably accomplished by plasma sputtering in an oxygen-free inert gas environment (such as an Ar gas environment) in an RF Magnetron Sputter deposition chamber. The substrate material may be Si having, for example, a 100 crystallographic orientation. The substrate material also may comprise other materials, including other semiconductor materials and materials with other crystallographic orientations.

Steps 2. PCMO Sputter Deposition to Obtain Thick (>300 nm) Films

| PCMO film Deposition | |
|---|---|
| Sputter Target | PCMO (e.g., SNO, NNO) |
| Ar (sccm) | 40 sccm |
| $O_2$ (sccm) | 0 sccm (oxygen free) |
| Total Pressure | 30 mTorr |
| RF power | 125 W |
| Substrate heated temperature | 450° C./500° C. |
| Cooling between depositions of layers of PCMO material | Substrate cooling to <50° C. after each ~150 μm layer deposition |
| In situ Annealing | No annealing needed |
| In Situ Cooling: <50° C. | Ar 40 sccm, No $O_2$, 30 mTorr |

In step 2, the process includes (see block 102 of FIG. 1) sputter deposition of a PCMO material on the cleaned substrate wafer (from step 1, block 100) occurs in a Magnetron Sputter deposition chamber with the substrate temperature being raised to at least a temperature equal to the temperature of PCMO crystallization (e.g., $\geq 450°$ C. for $SmNiO_3$ and $NdNiO_3$) in an oxygen-free inert gas (e.g., Ar) environment, preferably at a pressure between 5 and 50 mtorr. The RF power and substrate bias may be adjusted to produce a desired deposition rate of the PCMO material. The pressure may be adjusted to obtain a desired atomic/elemental composition of the PCMO material. The PCMO material may be selected from the group consisting of $NdNiO_3$, $SmNiO_3$, $PrNiO_3$, $EuNiO_3$, or $GdNiO_3$, or any combination of $NdNiO_3$, $SmNiO_3$, $PrNiO_3$, $EuNiO_3$, and $GdNiO_3$.

The sputter deposition of the PCMO material is done in repeated cycles (see blocks 102-106 of FIG. 1) of deposition of thin (e.g., 150 nm or less in thickness) PCMO film layers at the elevated temperature noted above followed by substrate cooling (block 104) to $\leq 50°$ C. between the deposition of each PCMO film layer. This heating/deposition/cooling cycle is repeated (see block 106) until the desired thick film thickness is reached.

Step 2 includes cooling (see block 104) the deposited film (for example, to $\leq 50°$ C.) to avoid thermal shock to the wafer when removed, for example, (unloaded) from the Magnetron Sputter deposition chamber. Cooling preferably occurs in an oxygen-free inert gas (e.g., Ar) environment.

Figure 3:
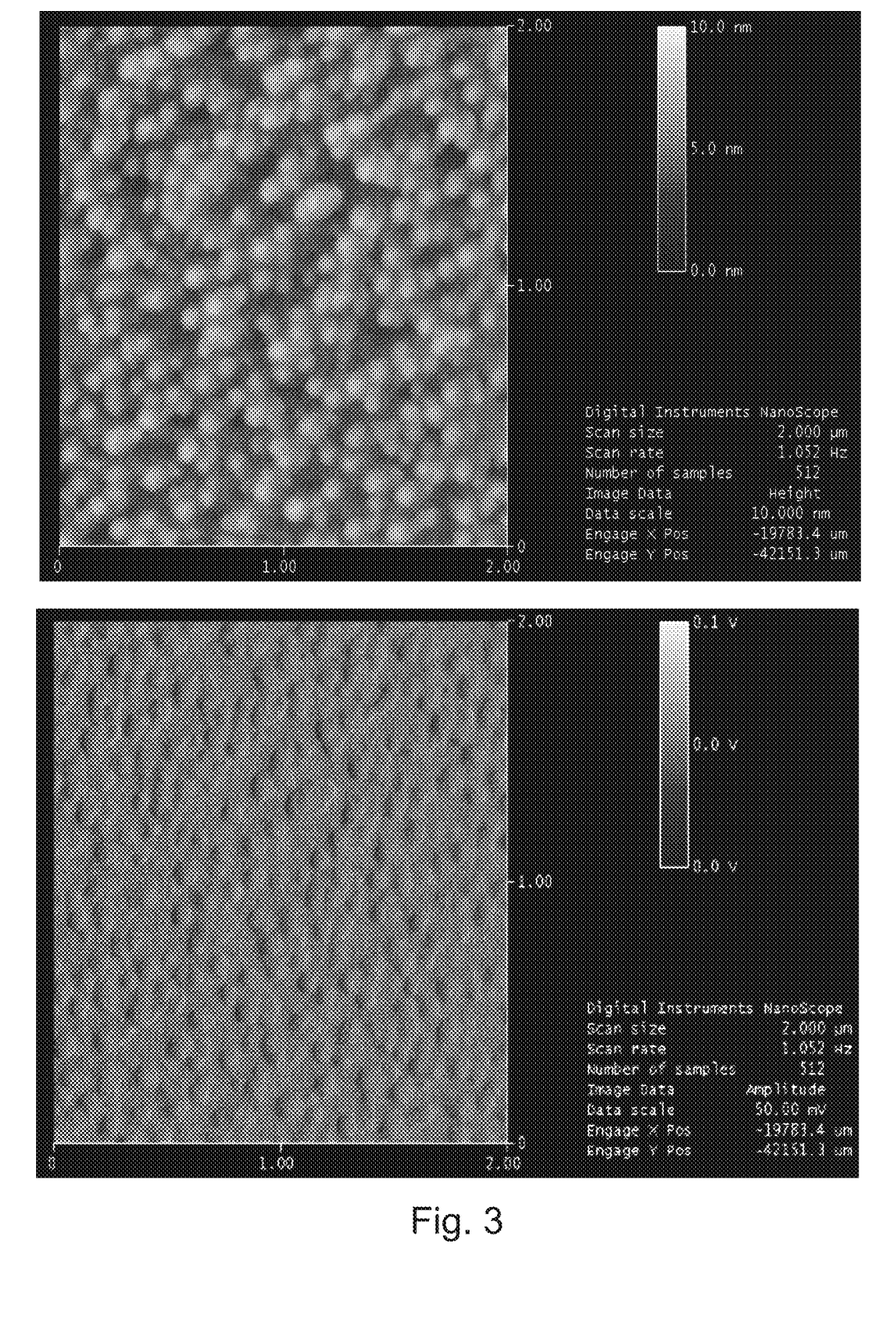
FIG. 3 provide Atomic Force Microscopy (AFM) images of stoichiometric crystalline $NdNiO_3$ film (NNO, 500 Å thick) deposited on a Si(100) substrate at 500° C., using RF magnetron sputtering. The upper image is a height map while the lower image is an amplitude map of the AFM probe.

The accompanying figures show the initial results acquired using the process described above. FIG. 3 provides Atomic Force Microscopy (AFM) images of stoichiometric crystalline NdNiO$_3$ film (NNO), deposited to a 50 nm thickness on a Si(100) substrate at 500° C., using RF magnetron sputtering.

Figure 4:
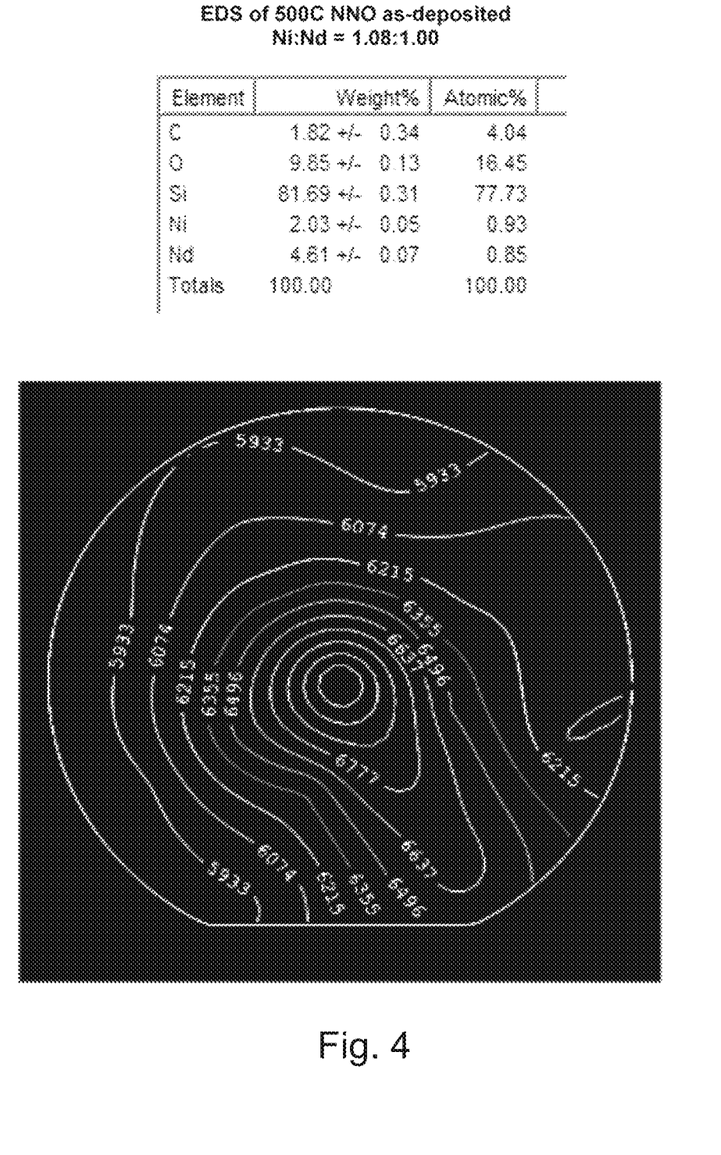
FIG. 4 presents the results of atomic elemental analysis (EDS) and also shows the sheet resistance (Rs), the sheet resistance $R_s$ measurement of the same NNO thin film deposited on the Si(100) at 500° C. discussed with reference to FIG. 3. Atomic elemental analysis carried out with EDS (Energy Dispersive Spectra) indicates that the NNO films are stoichiometric with a Ni/Nd ratio of ~1.1. As-deposited NNO films have an average $R_s$~$6 \times 10^3$ ohm/sq.
Figure 5A:
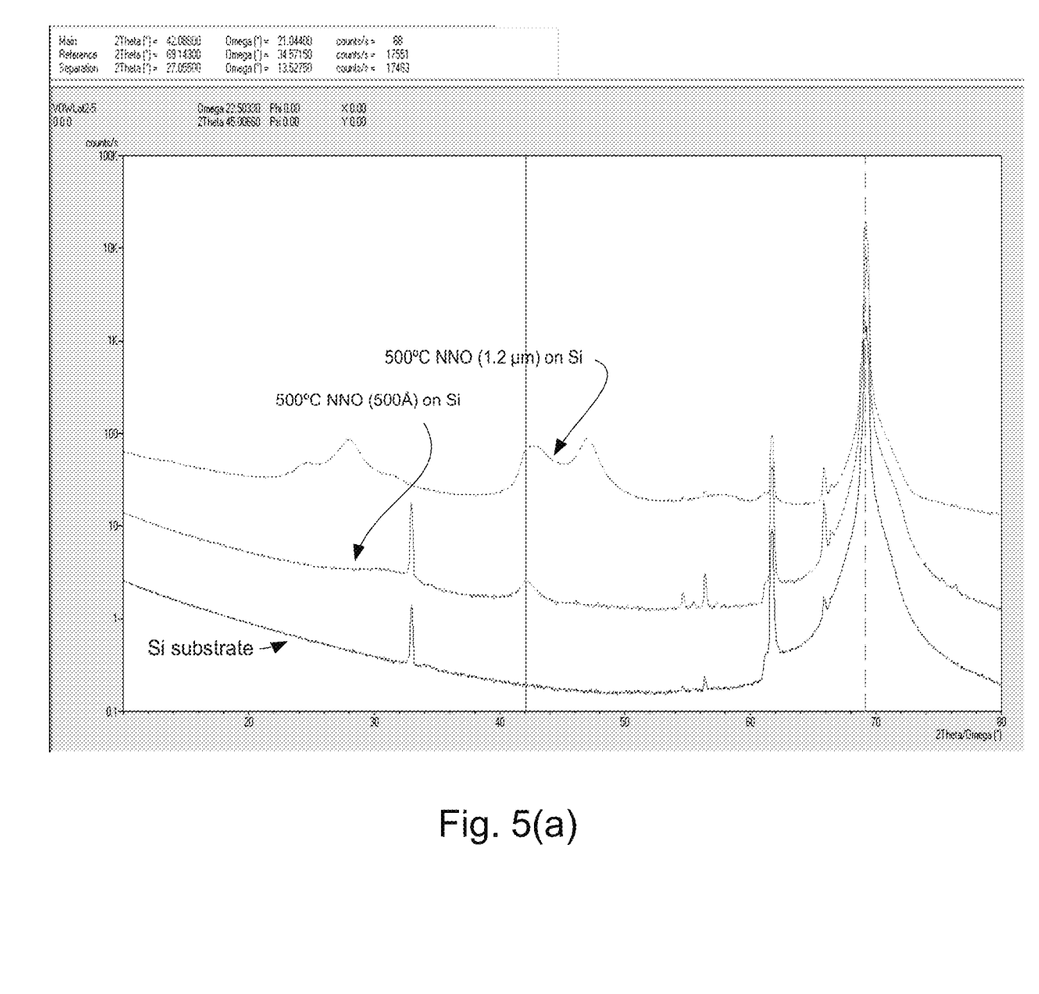
FIG. 5(a) shows X-Ray Diffraction (XRD) patterns and FIG. 5(b) shows the optical transmittance of NNO films grown on Si(100) substrates at 500° C. with NNO film thicknesses of 0.3 and 1.2 μm, showing clear crystallization and excellent optical transmittance (similar to that of a blank Si substrate) in IR.
Figure 5B:
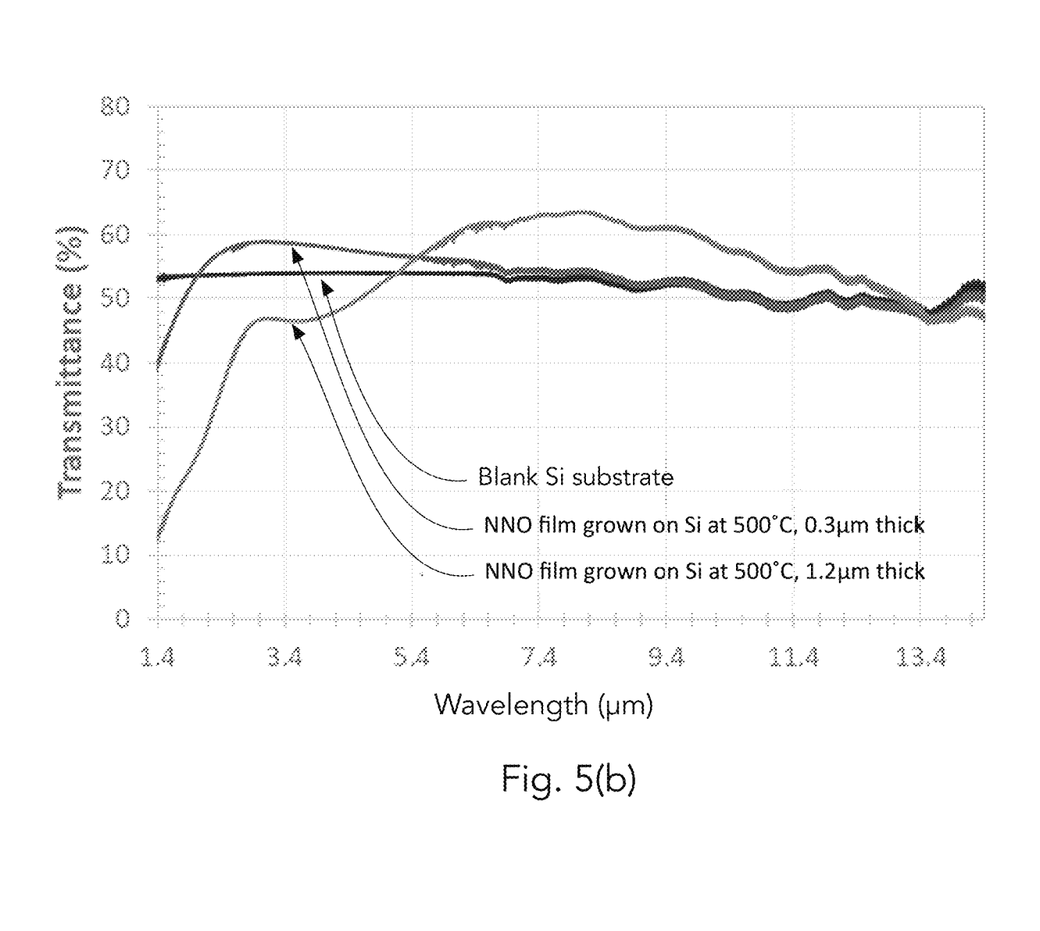
Figure 6A:
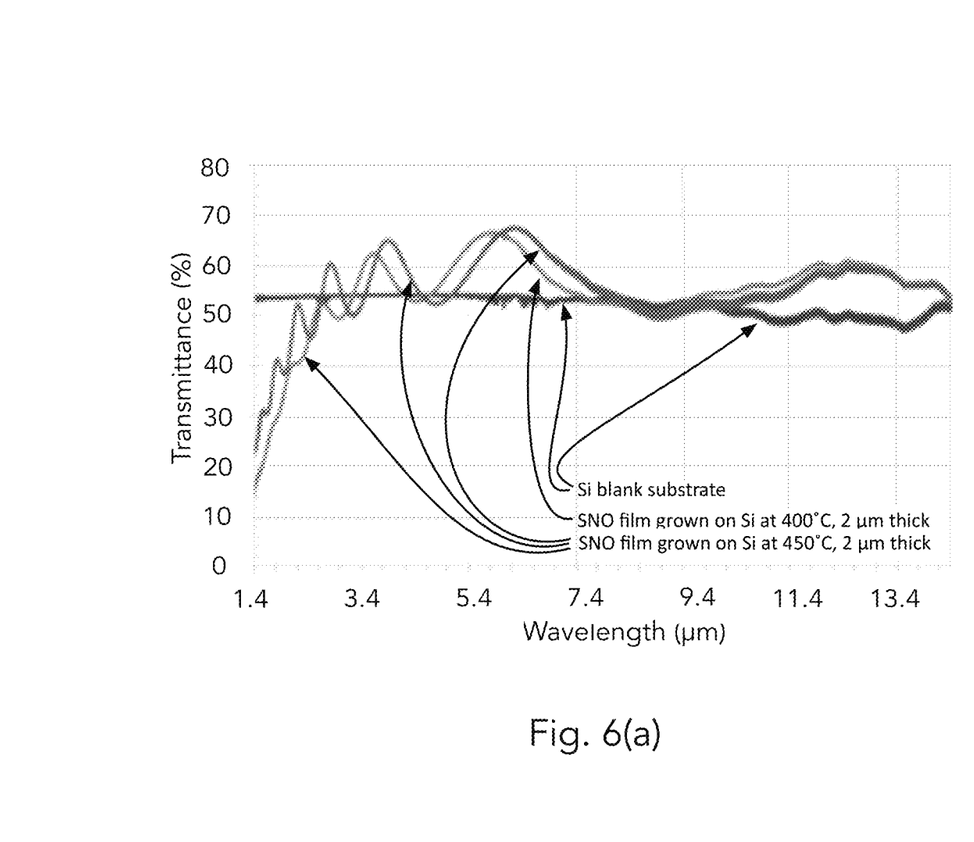
FIG. 6(a) is a graph of the optical transmittance of 2 μm thick $SmNiO_3$ (SNO) films grown on Si(100) substrates at 400° C. and 450° C., showing excellent IR transmittance. The optical transmittance of a bare Si substrate is also shown as a reference.
Figure 6B:
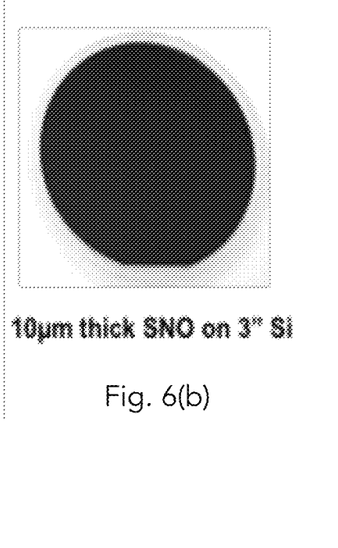
FIG. 6(b) is a photograph of 10 μm thick SNO film grown on a 3" Si(100) substrate. No delamination or structural degradation is observed.

FIG. 4 presents the results of atomic elemental analysis (EDS) and the sheet resistance (Rs) profile measurement of a NNO thin film having a thickness of approximately 50 nm was deposited on a Si(100) substrate at 500° C. with analysis carried out with EDS (Energy Dispersive Spectra) indicating that the NNO films are stoichiometric with a Ni/Nd ratio of ~1.1. As-deposited NNO films have a Rs of about $6 \times 10^3$ ohm/sq.

A Ni/Nd ratio of 1.1:1.0 is sufficiently close to 1:1 (from the formula NdNiO$_3$) to be considered stoichiometric by those skilled in the art. Thicker NNO films (for example, 150 nm thick NNO films) have also been analyzed and they too are stoichiometric by this definition.

The substrate material upon which the PCMO material was deposited was Si(100), but other substrate materials may be substituted therefor, including other crystallographic orientations of Si, SiO$_2$ and other materials (including group III-V semiconductors), but due to their differencing lattice constants, additional steps may need to be taken to engineer the substrate material to have a lattice constant more compatible with the PCMO being deposited.

The PCMO material deposited by sputtering is defined above as being SNO or NNO, but it is believed that the described process will, in general, as be suitable for use with other PCMO materials, such as PrNiO$_3$, EuNiO$_3$, or GdNiO$_3$, or any combination of NdNiO$_3$, SmNiO$_3$, PrNiO$_3$, EuNiO$_3$, and GdNiO$_3$.

Figure 2:
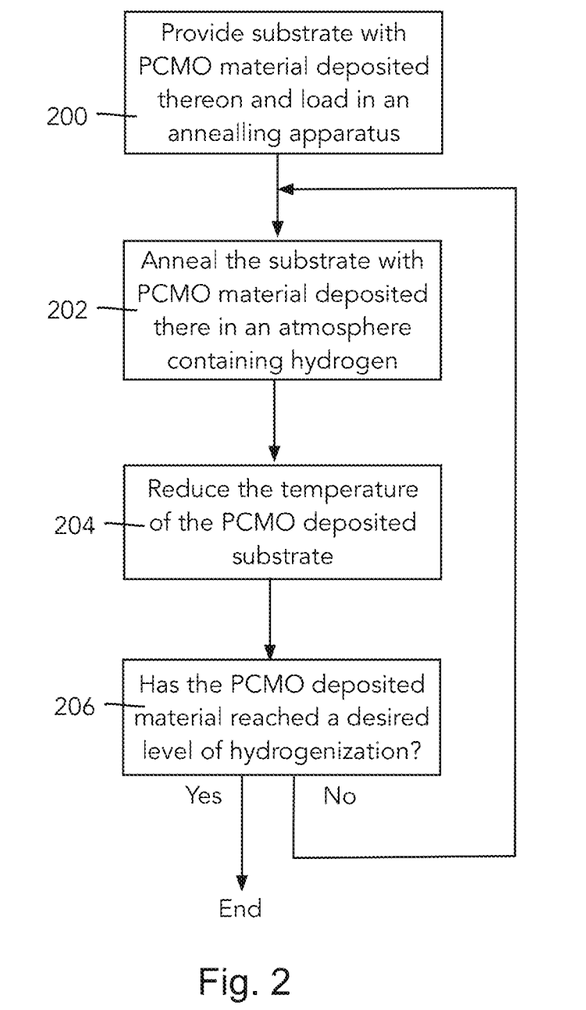
FIG. 2 is flow chart showing processing steps described below to anneal a substrate with PCMO material disposed thereon in a hydrogen atmosphere in order hydrogenate the PCMO material to thereby improve its transparency at IR wavelengths.

The processing described above with respect to FIG. 1 can be utilized, with some additional processing (including H-doping) as explained below with respect to FIG. 2, to make the crystalline NNO films, grown on a Si substrate, become IR transparent optical films with an extremely small optical loss, e.g., optical extinction coefficient, k, of at least <1E-5 over the entire IR wavelength range. See FIGS. 7 and 8(b). Alternatively, the processing of FIG. 2 can be utilized independently of the processing of FIG. 1 if desired.

This process (see FIG. 2), with H-doping, enables growing IR-transparent PCMO (Phase-Change Correlated Transition Metal oxides) optical films on Si substrates, for example, having an extremely small optical loss (i.e., optical extinction coefficient k at least <1E-5) over the entire infrared range. As can be seen from the graph of FIG. 8(b), the extinction coefficient k of H-doped crystalline NNO is better than merely <1E-5 as it appears to be actually <1E-10 over the entire IR range.

Important steps of this additional processing are described below, it being understood that these steps also preferably include the processing of FIG. 1:

Pre-cleaning the substrate wafer as done with the unmodified process (described above as Step 1 thereof) in block 100 of FIG. 1

Sputter deposition of a PCMO material on the cleaned substrate wafer from step 1, as done with the process described with respect to FIG. 1 as Step 2 thereof.

Preferably cooling the deposited film (for example, to about 50° C.) to avoid thermal shock to the wafer when removed (unloaded) from the Magnetron Sputter deposition chamber, as is also done with the unmodified process (and described above as part of Step 2 thereof). This cooling preferably occurs in an oxygen-free inert gas (e.g., Ar) environment before unloading the wafer. See block 106 of FIG. 1.

Loading the PCMO deposited wafer (see block 200 of FIG. 2), preferably in a Rapid Thermal Processing (RTA) system, and annealing at a temperature in a range of 100 to 250° C., and more preferably at a temperature of about 200° C., in the presence of a commercial forming gas (for example, 10% H$_2$+90% N$_2$), at a suitable flow rate (for example, 95 sccm) and at a suitable pressure (for example, 1 ATM or about 1 bar) to cause hydrogenation (hydrogen doping) of the PCMO film to occur. See block 202 of FIG. 2. The annealing time required for the hydrogenation of the PCMO film is dependent on the PCMO material selected and its film thickness. It was found that for a 50 nm thick NdNiO$_3$ film annealed at 200° C. that an eight-hour anneal comprising a two-hour anneal period repeated four times worked well and was most likely more than sufficient. The total eight hour anneal was split into four 2-hour time periods so that the hydrogenation of the PCMO film could be periodically checked. Longer anneal times will result in a higher hydrogen doping concentration. We subsequently determined that for a 120 nm thick NdNiO$_3$ film, a five-hour anneal appears to work well, while for a 300 nm thick NdNiO$_3$ film, we believe that a fifteen-hour anneal would work well. With some experimentation the user should be able to determine how short the anneal time can be, which will vary depending on the anneal temperature, the forming gas utilized, its flow rate, its pressure, the particular PCMO material being hydrogen doped and whether the anneal is performed step-wise or as a single event and still obtain a desirable level of hydrogen doping concentration in the PCMO material.

Instead of doping the PCMO material with hydrogen after it is deposited on the substrate, the doping may occur while the PCMO is being deposited. For example, consideration may be given to mixing H$_2$ gas with the inert gas used during the sputter deposition of the PCMO material. Alternatively, since the deposition of the PCMO may be accomplished as a series of steps of sputtering and cooling cycles, the hydrogenation anneal may occur after or before the cooling is completed.

An important feature in this modified process is hydrogen doping (see the annealing step in the two preceding paragraphs) of crystalline PCMO films, preferably at 200° C., using a forming gas (e.g., 10% hydrogen+90% nitrogen) without any need for catalytic transition materials (such as the Pt used in the prior art) during hydrogen doping. The use of a 200° C. low-temperature hydrogen doping without the need of integrating a catalytic transition metal (such as Pt, Pd or Ni) makes this process compatible with conventional micro-device fabrication techniques and allows chip- or wafer-level integration of this process into to CMOS ICs or Electro-Optic device fabrication techniques, which could not be achieved with the prior art.

Figure 7:
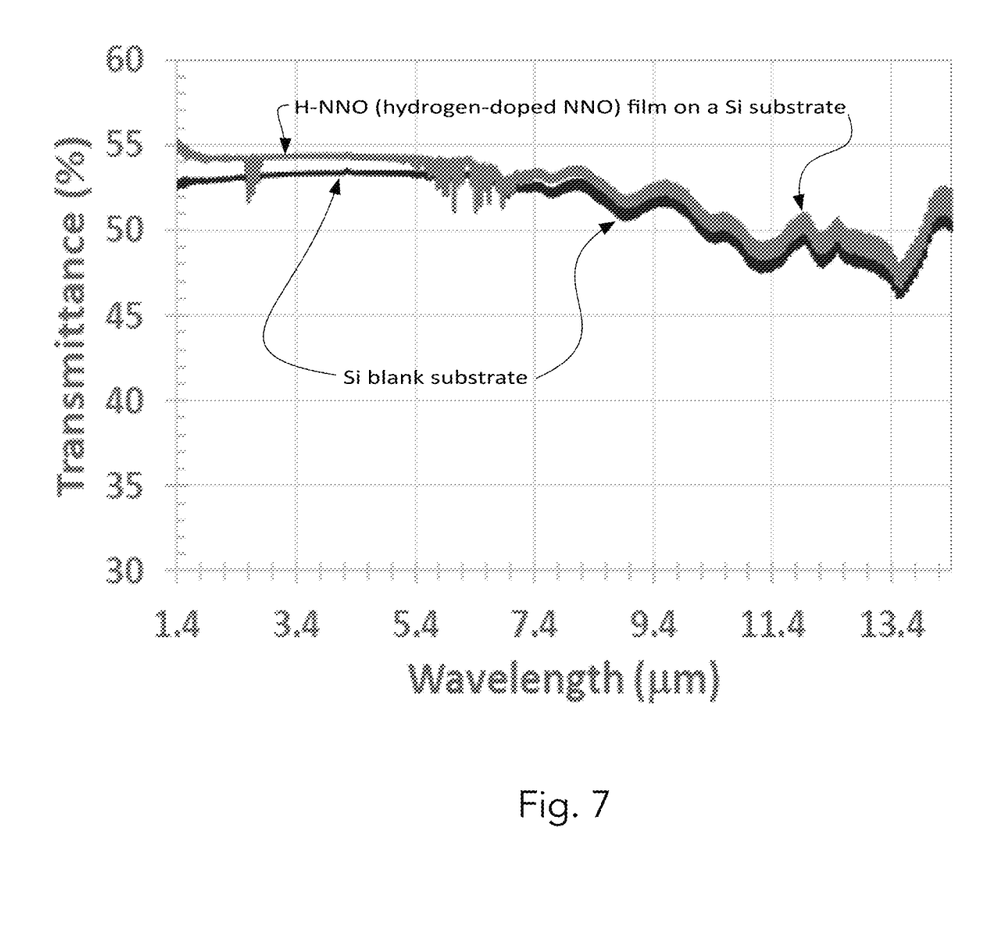
FIG. 7 is a graph of the Optical transmittance of H-doped NNO thin film grown on Si(100), showing its optical transparency over the entire SWIR-LWIR range.

FIG. 7 shows the optical transmittance spectrum of a hydrogen-doped polycrystalline NdNiO$_3$ (NNO) film deposited on a Si substrate as described above, in comparison with a bare Si substrate. The hydrogen-doped NdNiO$_3$ (H—NNO) film shows nearly perfect optical transmittance throughout the entire IR range.

Figure 8A:
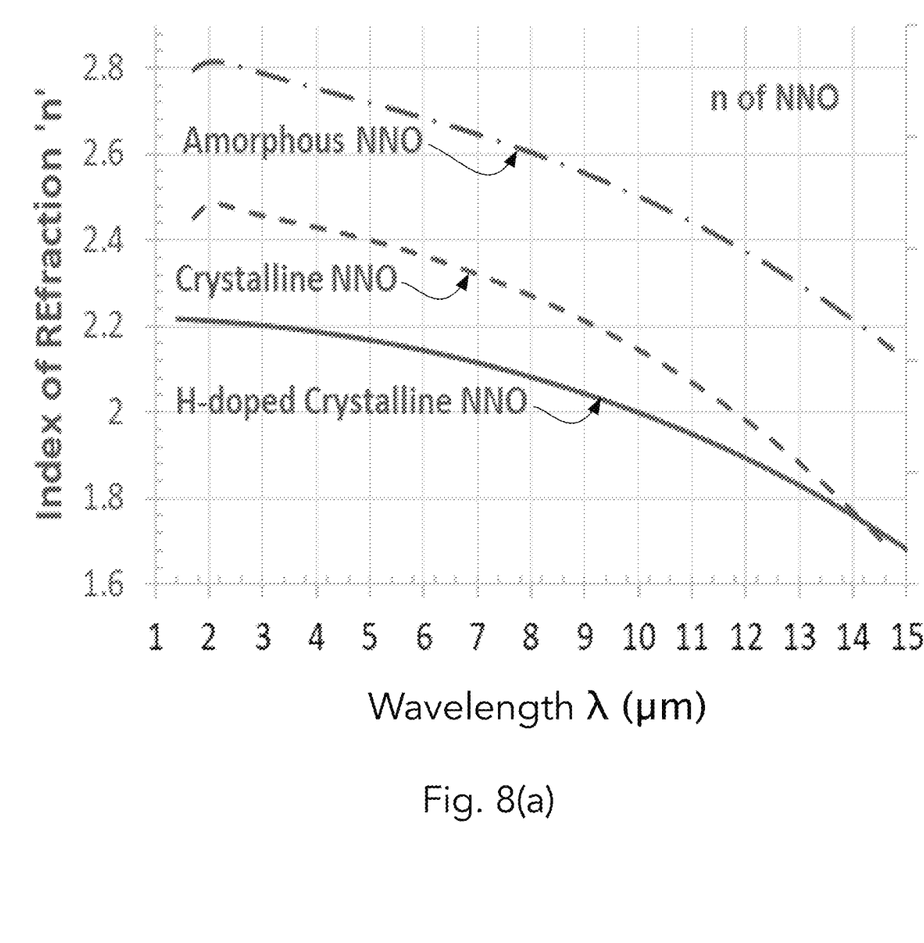
FIGS. 8(a) and 8(b) are graphs of n & k curves of H-doped crystalline NNO film acquired from IR spectroscopic ellipsometry, shown in comparison with as-deposited amorphous NNO film and as-deposited crystalline NNO film. The extinction coefficient k of at least <1E-5 over the entire IR range is extracted for the crystalline H—NNO, which is in good agreement with the optical transmittance data. As can be seen from the graph of FIG. 8(b), the extinction coefficient k is better than merely <1E-5 as it appears to be actually <1E-10 over the entire IR range.
Figure 8B:
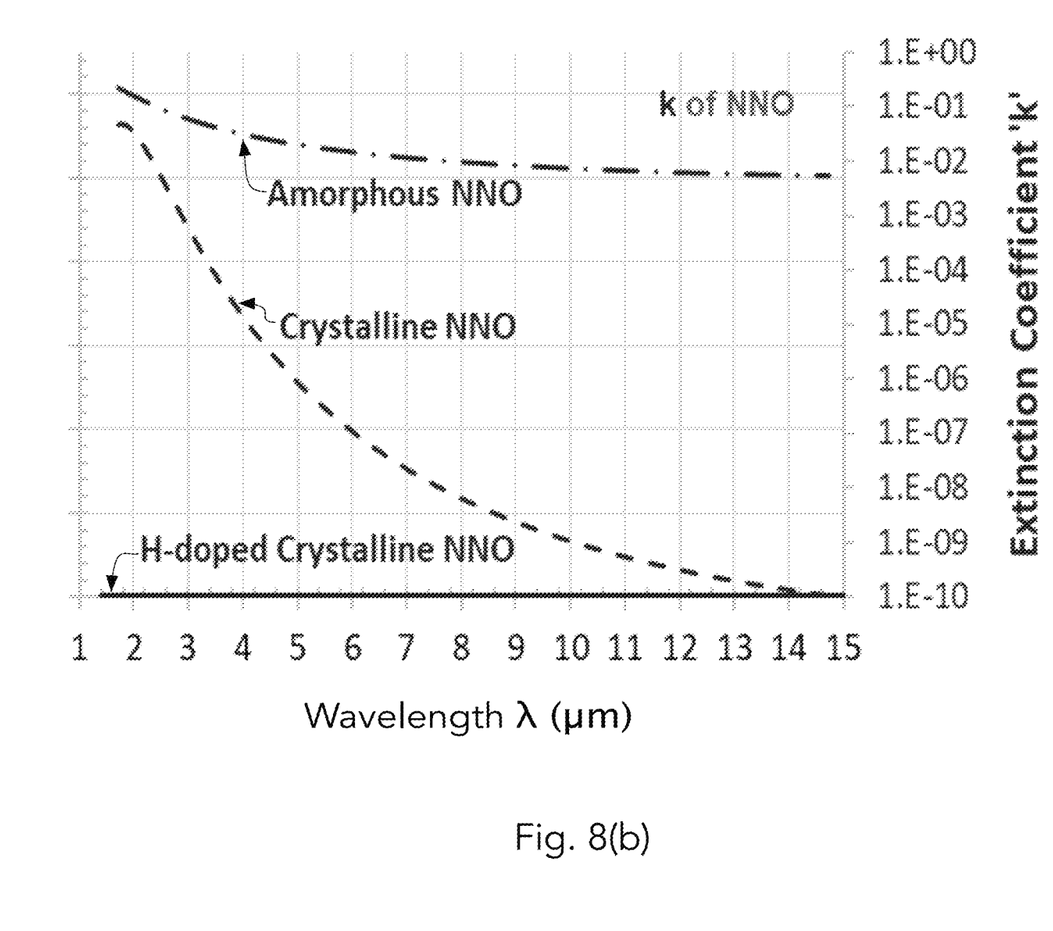
Figure 9:
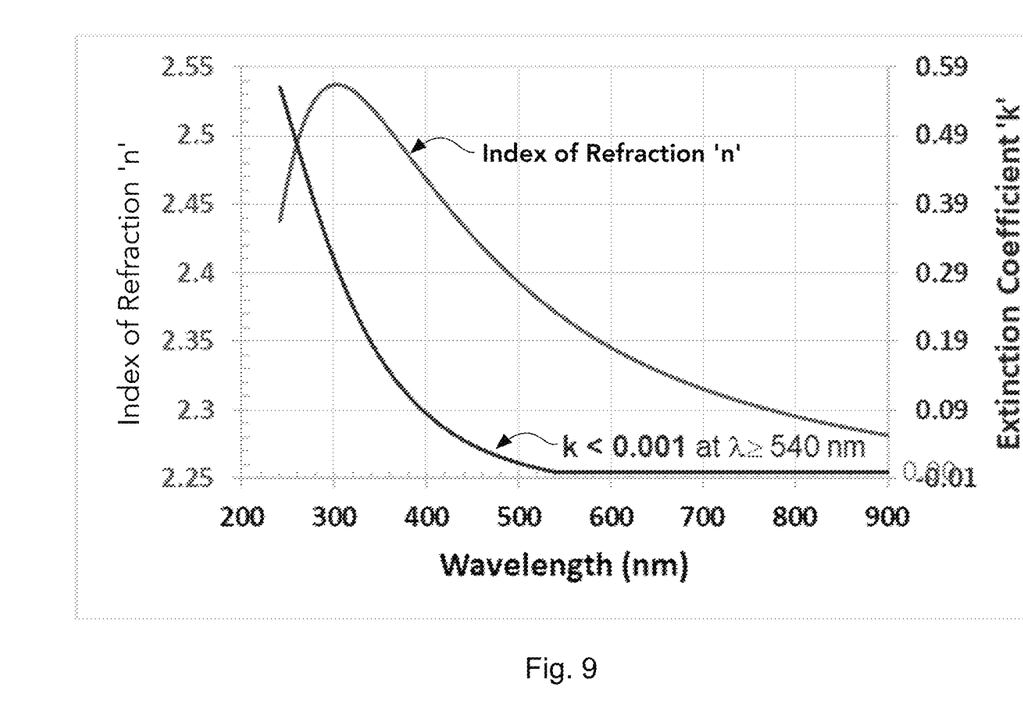
FIG. 9 shows graphs of n & k curves of H-doped crystalline NNO film acquired from spectroscopic ellipsometry carried out in the visible range. The extinction coefficient k of <0.001 is extracted for the wavelength range of 540 nm, indicating excellent optical transparency at wavelengths greater than 540 nm.

FIGS. 8(a) and 8(b) shows refractive index RI (n=n+i k, k: extinction coefficient) of a crystalline H—NNO film made according to the modified process described above, in comparison with as-deposited un-doped (i.e., not doped with hydrogen) amorphous and crystalline NNO films. The n and k curves extracted from IR spectroscopic ellipsometry measurements show the extinction coefficient k at least <1.0E-5 for the crystalline H—NNO film over the entire IR range of FIG. 8(b). For comparison, k=6.0E-2 for the amorphous un-doped NNO film and k=6.0E-4 for the crystalline un-doped NNO film are noted at λ=3 μm. The optical transparency of crystalline H—NNO seems to extend to the visible range (see FIG. 9).

The spectroscopic ellipsometry carried out in the visible range (see FIG. 9) indicates an extremely small k (<1E-5) for crystalline H—NNO in the visible wavelength range of 540 nm.

The PCMO film that was subjected to hydrogenation, as described above, was $NdNiO_3$, but it is believed that this process may be used with other PCMO films, including $SmNiO_3$, $PrNiO_3$, $EuNiO_3$, or $GdNiO_3$, or any combination of $NdNiO_3$, $SmNiO_3$, $PrNiO_3$, $EuNiO_3$, and $GdNiO_3$. The substrate material on which the NNO film was deposited was Si, but it is believed that this process may be used with other substrate materials, including other semiconductor materials than Si.

Having now described embodiments of the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order.

As used in this document, "each" refers to each member of a set or each member of a subset of a set.

Color versions of FIGS. 3, 4, 5(a), 5(b), 6(a), 6(b), 7, 8(a), 8(b), and 9 of this application are attached hereto as Appendix A, which may provide additional information beyond that disclosed in the black and while versions thereof in the accompanying figures.

What is claimed is:

1. A method of growing a stoichiometric crystalline IR-transparent Phase-Change Correlated Transition Metal Oxide (PCMO) optical film of a desired thickness on a substrate, the method comprising:
    a. heating the substrate to a temperature at least equal to the temperature of crystallization of a PCMO material to be deposited thereon in an oxygen-free gas environment,
    b. depositing the PCMO material onto the substrate while at said temperature at least equal to the temperature of crystallization of the PCMO material;
    c. cooling the substrate with the PCMO material deposited thereon to a temperature substantially less than the temperature of crystallization of the PCMO material in an oxygen-free gas environment;
    d. heating the substrate previously cooled at step c to a temperature at least equal to the temperature of crystallization of the PCMO material to be deposited thereon in an oxygen-free gas environment,
    e. depositing the PCMO material onto previously deposited PCMO material while at said temperature at least equal to the temperature of crystallization of the PCMO material; and
    f. repeating steps c, d and e until said desired thickness of the PCMO optical film on the substrate is obtained.

2. The method of claim 1 wherein in steps b, and e, depositing occurs by sputtering in an oxygen-free gas environment that includes hydrogen to thereby dope the deposited PCMO material with hydrogen.

3. The method of claim 2 wherein in steps b, and e, the oxygen-free gas environment includes nitrogen.

4. The method of claim 1 wherein no seed layer for the PCMO material is deposited on the substrate between steps a and b.

5. A process for growing Phase-Change Correlated Transition Metal Oxide (PCMO) material on a substrate, the PCMO material being deposited on the substrate in a plurality of deposition steps in an oxygen-free gas environment at an elevated temperature during each deposition step, the plurality of deposition steps being separated from each other by a cooling step wherein the elevated temperature of the oxygen-free gas environment is reduced to a temperature substantially less than said elevated temperature.

6. The process of claim 5 wherein the elevated temperature is at least equal to the temperature of crystallization of the PCMO material to be deposited and wherein the temperature substantially less than said elevated temperature is no more than 100° C.

7. The process of claim 6 wherein the temperature substantially less than said elevated temperature is no more than 50° C.

8. The process of claim 5 wherein the substrate does not require a seed layer to be provided thereon prior to PCMO deposition.

9. The process of claim 5 wherein a post-deposition annealing process is performed on the substrate with the PCMO material deposited thereon in an environment containing at least hydrogen.

10. The process of claim 5 wherein the deposited PCMO material is stoichiometric.

11. The process of claim 5 wherein a difference between said elevated temperature and said temperature substantially less than said elevated temperature is more than 300° C.

12. The process of claim 11 wherein said temperature substantially less than said elevated temperature is no more than 50° C.

13. The process of claim 5 where the deposited PCMO material is selected from the group consisting of $NdNiO_3$, $SmNiO_3$, $PrNiO_3$, $EuNiO_3$, and $GdNiO_3$ and combinations thereof and wherein the deposited PCMO material is deposited by sputtering.

14. The process of claim 5 wherein the deposited PCMO material is stoichiometric $NdNiO_3$.

15. The process of claim 14 wherein the atomic ratio of Ni to Nd atoms in the deposited stoichiometric $NdNiO_3$ is about 1.1 to 1.0.

16. The method of claim 5 wherein in the plurality of deposition steps occur in an oxygen-free gas environment that includes hydrogen to thereby dope the deposited PCMO material with hydrogen.

17. The method of claim 16 wherein the oxygen-free gas environment includes nitrogen.

* * * * *